United States Patent
Loubet et al.

(10) Patent No.: US 11,984,493 B2
(45) Date of Patent: May 14, 2024

(54) FORMATION OF NANOSHEET TRANSISTOR CHANNELS USING EPITAXIAL GROWTH

(71) Applicant: International Business Machines Corporation, Armonk, NY (US)

(72) Inventors: Nicolas Loubet, Guilderland, NY (US); Shogo Mochizuki, Mechanicville, NY (US); Kirsten Emilie Moselund, Rüschlikon (CH); Cezar Bogdan Zota, Rüschlikon (CH)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 17/483,216

(22) Filed: Sep. 23, 2021

(65) Prior Publication Data

US 2023/0088757 A1    Mar. 23, 2023

(51) Int. Cl.
| H01L 29/66 | (2006.01) |
| H01L 21/02 | (2006.01) |
| H01L 29/06 | (2006.01) |
| H01L 29/423 | (2006.01) |
| H01L 29/786 | (2006.01) |

(52) U.S. Cl.
CPC .... H01L 29/66742 (2013.01); H01L 21/0259 (2013.01); H01L 29/0665 (2013.01); H01L 29/42392 (2013.01); H01L 29/78618 (2013.01); H01L 29/78696 (2013.01); *H01L 29/66553* (2013.01)

(58) Field of Classification Search
CPC ....... H01L 21/823814; H01L 29/66553; H01L 29/42392; H01L 29/0673
See application file for complete search history.

(56) References Cited

U.S. PATENT DOCUMENTS

| 9,490,323 | B2 | 11/2016 | Rodder et al. |
| 10,170,484 | B1 | 1/2019 | Sung et al. |
| 10,192,867 | B1 | 1/2019 | Frougier et al. |
| 10,367,077 | B1 | 7/2019 | Loubet et al. |
| 2021/0098302 | A1 | 4/2021 | Ju et al. |
| 2021/0118884 | A1 | 4/2021 | Liaw |

*Primary Examiner* — John A Bodnar
(74) *Attorney, Agent, or Firm* — L. Jeffrey Kelly; Ryan, Mason & Lewis, LLP (57) ABSTRACT

A semiconductor structure comprises a plurality of gate structures alternately stacked with a plurality of channel layers, and a plurality of epitaxial source/drain regions connected to the plurality of channel layers. The plurality of channel layers are connected to the plurality of epitaxial source/drain regions via a plurality of epitaxial extension regions. Respective pairs of adjacent channel layers of the plurality of channel layers are connected to a given one of the plurality of epitaxial source/drain regions via respective ones of the plurality of epitaxial extension regions.

20 Claims, 9 Drawing Sheets

FORMATION OF NANOSHEET TRANSISTOR CHANNELS USING EPITAXIAL GROWTH

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming nanosheet transistor channels by epitaxially growing channel layers around sacrificial semiconductor layers.

In one embodiment, a semiconductor structure comprises a plurality of gate structures alternately stacked with a plurality of channel layers, and a plurality of epitaxial source/drain regions connected to the plurality of channel layers. The plurality of channel layers are connected to the plurality of epitaxial source/drain regions via a plurality of epitaxial extension regions. Respective pairs of adjacent channel layers of the plurality of channel layers are connected to a given one of the plurality of epitaxial source/drain regions via respective ones of the plurality of epitaxial extension regions.

In another embodiment, a method of forming a semiconductor structure comprises forming a plurality of first semiconductor layers alternately stacked with a plurality of second semiconductor layers, forming a plurality of epitaxial source/drain regions extending from the plurality of first semiconductor layers, and removing the plurality of second semiconductor layers. Portions of the plurality of first semiconductor layers are removed to reduce a thickness of respective ones of the plurality of first semiconductor layers, a plurality of epitaxial channel layers are grown around the respective ones of the plurality of first semiconductor layers, and the respective ones of the plurality of first semiconductor layers are removed.

In another embodiment, a nanosheet structure comprises a plurality of channel layers in a stacked configuration, and a plurality of epitaxial source/drain regions extending from sides of the plurality of channel layers. The plurality of epitaxial source/drain regions extend from the sides of the plurality of channel layers via a plurality of epitaxial extension regions. A given pair of adjacent channel layers of the plurality of channel layers is connected to a given one of the plurality of epitaxial source/drain regions via the same epitaxial extension region of the plurality of epitaxial extension regions.

In another embodiment, a gate-all-around nanosheet device comprises a plurality of stacked channels and a plurality of source/drain regions on lateral sides of the plurality of stacked channels. At least two consecutively stacked channels share the same connective portion to a source/drain region of the plurality source/drain regions. Regions between the plurality of stacked channels comprise a plurality of stacked gate structures.

In another embodiment, a method of forming a nanosheet structure comprises recessing a plurality of spacers formed on sides of the nanosheet structure, thinning a plurality of mandrel channel portions formed in a stacked configuration, growing a plurality of epitaxial channel regions on the plurality of mandrel portions, and selectively removing the plurality of mandrel channel portions with respect to the plurality of epitaxial channel regions.

DETAILED DESCRIPTION

Illustrative embodiments of the invention may be described herein in the context of illustrative methods for forming nanosheet transistor structures with inner spacer configurations to prevent etchant damage to source/drain regions during nanosheet release, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Nanosheets are relatively thin sheets, for example, with dimensions measured in nanometers (nm). Nanosheets are elliptical or rectangular shaped, or approximately elliptical or rectangular shaped in cross section and have thicknesses or heights such as, for example, less than about 5 nm or 10 nm. The width of a nanosheet may be considerably larger than this height, such as about 20 nm to about 60 nm in the case of a nanosheet which is about 4 nm to about 8 nm in height. The thickness of a nanosheet layer, or height of the rectangle in cross section, affects the electrostatics of the nanosheet.

Nanosheet devices can be viable device options instead of fin field-effect transistors (FinFETs). For example, nanosheets can be used as the fin structure in a dual-gate, tri-gate or gate-all-around (GAA) FET device. CMOS scaling can be enabled by the use of stacked nanosheets, which offer superior electrostatics and higher current density per footprint area than FinFETs.

In order to increase performance and scaling of nanosheet transistors, there is a need to develop a larger effective width ($W_{eff}$) per active device footprint. The effective width of a channel refers to the portion of the channel activated by application of a threshold voltage. At a given active footprint, vertically stacking more nanosheet channels increases effective width. Under conventional techniques, an increase in effective width is attempted by increasing the number of silicon germanium/silicon stacks in a superlattice. However, there are limitations with current techniques in that gates lean or bend in the case of tall nanosheet stacks. In addition, nanosheet stack height significantly impacts effective capacitance and external resistance, such that performance is saturated for larger than three nanosheet stacks.

Illustrative embodiments provide techniques for forming nanosheet transistor structures where the number of nanosheet channels is increased without increasing nanosheet stack height and epitaxial source/drain region volume. As explained in more detail herein, in accordance with one or more embodiments, following dummy gate and sacrificial semiconductor layer removal, (e.g., silicon germanium layer release), dielectric inner spacers are recessed to expose epitaxial region extension portions. Remaining channel layers from the original nanosheet stack (referred to herein as "mandrel channel portions" or "sacrificial channel portions") are trimmed to a narrower height. Channel material is grown from the exposed extension portions, and is formed around the trimmed mandrel channel portions. The channel material on sides of the mandrel channel portions is removed to expose the mandrel channel portions, and a sacrificial etch of the mandrel channel portions is performed. The number of remaining channel material portions is double that of the mandrel channel portions, thereby doubling the number of channels in the nanosheet stack without increasing the height of the stack. Along with providing twice the effective width, the embodiments improve effective capacitance, since the nanosheet stack is not taller, and do not impact external resistance because the volume of the source/drain epitaxial regions does not change.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawings. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

The cross-sections in FIGS. 1A, 2A, 3A, 4A, 5A, 6A, 7A and 8A are taken along a first direction perpendicular to a gate extension direction, and the cross-sections in FIGS. 1B, 2B, 3B, 4B, 5B, 5C, 5D, 6B, 6C, 7B, 7C and 8B are taken along a second direction perpendicular to a gate extension direction.

Figure 1A:
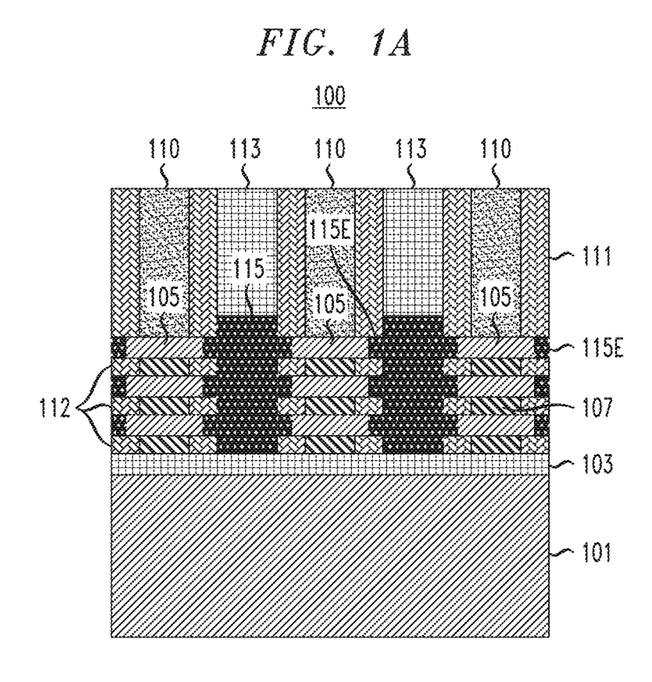
FIGS. 1A and 1B are schematic cross-sectional views illustrating nanosheet structures comprising dummy gates and sacrificial semiconductor layers, according to an embodiment of the invention.
Figure 1B:
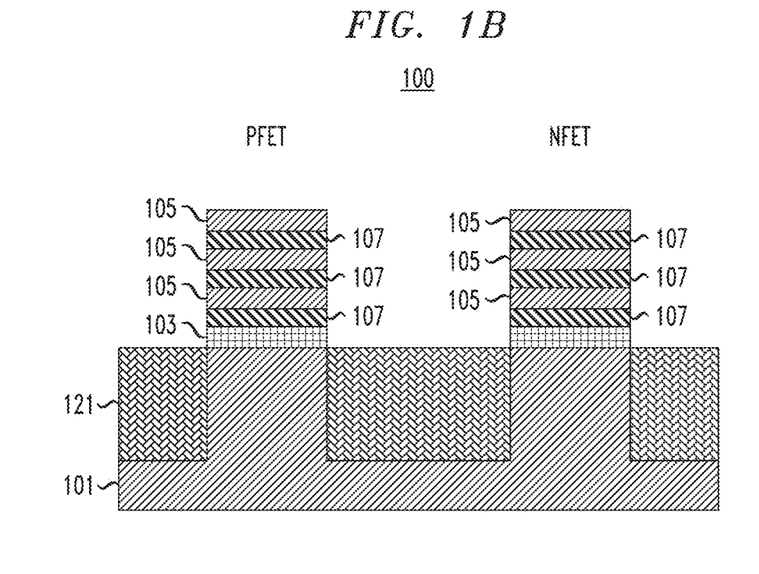

FIGS. 1A and 1B are schematic cross-sectional views illustrating a device 100 with nanosheet structures comprising dummy gate structures 110 and mandrel channel portions 105 and sacrificial semiconductor layers 107 in stacked structures. The mandrel channel portions 105 are also sacrificial semiconductor layers, but for clarity are referred to differently than the sacrificial semiconductor layers 107. As explained further herein, the mandrel channel portions 105 and the sacrificial semiconductor layers 107 are removed at different stages of processing and eventually replaced with gate structures. As explained further herein, the dummy gate structures 110 are also replaced with gate structures.

Referring to FIGS. 1A and 1B, a semiconductor substrate 101 comprises semiconductor material including, but not limited to, silicon (Si), silicon germanium (SiGe), III-V, II-V compound semiconductor materials or other like semiconductor materials. In addition, multiple layers of the semiconductor materials can be used as the semiconductor material of the substrate.

In accordance with an embodiment of the present invention, processing may start with a pre-fabricated semiconductor-on-insulator structure comprising the isolation layer 103 pre-formed on the semiconductor substrate 101, and a lower silicon layer pre-formed on an isolation layer 103. The isolation layer 103 may comprise, for example, silicon oxide ($SiO_x$) (where x is for example, 2, 1.99 or 2.01), silicon oxycarbide (SiOC), silicon oxycarbonitride (SiOCN) or some other dielectric. Alternatively, if a bulk substrate is used, a sacrificial semiconductor layer between the semiconductor substrate 101 and a stacked structure of the silicon layers (eventually patterned into the mandrel channel portions 105) and silicon germanium layers (eventually patterned into the sacrificial semiconductor layers 107) is removed using, for example, an aqueous solution containing ammonium hydroxide ($NH_4OH$) and hydrogen peroxide ($H_2O_2$) or a gas containing hydrogen fluoride (HF). Following the removal of the sacrificial semiconductor layer, a dielectric layer is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), followed by an etch back to form the isolation layer 103 on the semiconductor substrate 101.

Depending on whether a semiconductor-on-insulator structure or bulk substrate is used, layers of silicon and silicon germanium are epitaxially grown in an alternating and stacked configuration on the sacrificial semiconductor layer, or on a lower silicon layer. In either case, a first silicon germanium layer is followed by a first silicon layer on the first silicon germanium layer, which is followed by a second silicon germanium layer on the first silicon layer, and so on. As can be understood, the silicon and silicon germanium layers are epitaxially grown from their corresponding underlying semiconductor layers.

While three mandrel channel portions 105 (e.g., silicon) and three sacrificial semiconductor layers 107 (e.g., silicon germanium) are shown in each patterned nanosheet stack, the embodiments of the present invention are not necessarily limited to the shown number of mandrel channel portions 105 and sacrificial semiconductor layers 107, and there may be more or less layers in the same alternating configuration depending on design constraints. As noted above, and explained further herein, the mandrel channel portions 105 and the sacrificial semiconductor layers 107 (e.g., silicon and silicon germanium layers) are removed at different stages of processing and eventually replaced with gate structures.

Although silicon germanium is described as the material for the sacrificial semiconductor layers 107, and silicon is described as the material for the mandrel channel portions 105, other materials can be used. For example, the mandrel channel portions 105 can be silicon germanium with a germanium percentage of 20% (SiGe20), and the sacrificial semiconductor layer 107 can be silicon germanium with a germanium percentage of 60% (SiGe60). Sacrificial semiconductor layers 107 have the property of being able to be removed selectively compared to the material of mandrel channel portions 105.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a metal-organic chemical vapor deposition (MOCVD), rapid thermal chemical vapor deposition (RT-CVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

In a non-limiting illustrative embodiment, a height of the sacrificial semiconductor layers 107 can be in the range of about 6 nm to about 15 nm depending on the application of the device. In accordance with an embodiment of the present invention, the mandrel channel portions 105 can include the same or a similar composition to the semiconductor substrate 101. In a non-limiting example, a height of the mandrel channel portions 105 can be in the range of about 6 nm to about 15 nm depending on the desired process and application. In accordance with an embodiment of the present invention, each of the mandrel channel portions 105 has the same or substantially the same composition and size as each other, and each of the sacrificial semiconductor layers 107 has the same or substantially the same composition and size as each other.

Respective dummy gate structures 110 and pairs of gate spacers 111 correspond to the three nanosheet stacks. It is to be understood that although three nanosheet stacks of mandrel channel portions 105 and sacrificial semiconductor layers 107 are shown, the embodiments are not necessarily limited thereto, and more or less than three nanosheet stacks similarly configured on the semiconductor substrate 101 may be used. The nanosheet stacks are separated by epitaxial source/drain regions 115 and inter-level dielectric (ILD) layers 113 there between. Each dummy gate structure 110 is disposed on a stacked configuration of mandrel channel portions 105 and sacrificial semiconductor layers 107 (e.g., silicon and silicon germanium layers). The dummy gate structures 110 include, but are not necessarily limited to, an amorphous silicon (a-Si) layer formed over a thin layer of $SiO_x$. The dummy gate structures 110 are deposited using deposition techniques such as, for example, CVD, PECVD, RFCVD, PVD, ALD, MBD, PLD, LSMCD, sputtering and/or plating, followed by a planarization process, such as, chemical mechanical polishing (CMP), and lithography and etching steps to remove excess gate material, and pattern the deposited layer.

The gate spacers 111 are formed on sides of the dummy gate structures 110, and can be formed by one or more of the deposition techniques noted in connection with deposition of the dummy gate material. The gate spacers 111 are formed from material comprising for example, one or more dielectrics, including, but not necessarily limited to, silicon nitride (SiN), silicon carbide (SiC), silicon oxynitride (SiON), SiOC, silicon-carbon-nitride (SiCN), boron nitride (BN), silicon boron nitride (SiBN), silicoboron carbonitride (SiBCN), SiOCN, $SiO_x$, and combinations thereof. The gate spacers 111 can be formed by any suitable techniques such as deposition followed by directional etching. Deposition may include but is not limited to, ALD or CVD. Directional etching may include but is not limited to, reactive ion etching (RIE).

Inner spacers 112 are formed on lateral sides of the sacrificial semiconductor layers 107. In accordance with an embodiment, the inner spacers 112 can comprise the same or similar dielectric material as or a different dielectric material from that of the gate spacers 111. For example, the material of the inner spacers 112 can comprise, but is not necessarily limited to, an oxide, such as $SiO_x$, $TiO_x$, $AlO_x$, etc. or a nitride, such as SiN, SiBCN, etc.

Epitaxial source/drain regions 115 extend from sides of the mandrel channel portions 105 of the nanosheet stacks. A plurality of epitaxial extension regions 115E oriented between sides of the mandrel channel portions 105 and epitaxial source/drain regions 115, connect the mandrel channel portions 105 to the epitaxial source/drain regions 115. The epitaxial extension regions 115E are disposed over and/or under the inner spacers 112 in a stacked configuration. For example, some of the inner spacers 112 are disposed between respective ones of the epitaxial extension regions 115E, and lowermost ones of the inner spacers 112 are disposed under respective ones of the epitaxial extension regions 115E. Side portions of the sacrificial semiconductor layers 107 (e.g., silicon germanium layers) are covered with the inner spacers 112 during epitaxial growth of epitaxial source/drain regions 115.

According to a non-limiting embodiment of the present invention, the conditions of the epitaxial growth process for the epitaxial source/drain regions 115 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure range of about 450° C. to about 800° C., and about 5 Torr-about 300 Torr. While embodiments of the present invention may be described in connection with source/drain regions for a p-type FET (PFET) comprising, for example, silicon germanium source/drain regions, the embodiments are not necessarily limited thereto. The embodiments can also be used in connection with the formation of source/drain regions for n-type FETs (nFETs) comprising, for example, silicon source/drain regions.

After further processing, the epitaxial source/drain regions 115 become the source/drain regions for transistor devices, such as, for example, nFETs or pFETs, and can comprise in-situ phosphorous doped (ISPD) silicon or Si:C for n-type devices, or in-situ boron doped (ISBD) silicon germanium for p-type devices, at concentrations of about $1 \times 10^{19}/cm^3$ to about $3 \times 10^{21}/cm^3$. By "in-situ," it is meant that the dopant that dictates the conductivity type of the doped layer is introduced during the process step, e.g., epitaxial deposition, which forms the doped layer.

Referring to the cross-section in FIG. 1B, isolation regions 121 (e.g., shallow trench isolation (STI) regions) are formed adjacent p-type and n-type (pFET and nFET) nanosheet transistors. The isolation regions 121 may comprise, for example, high-temperature oxide (HTO), field oxide (FOX) or some other dielectric or combination of dielectrics. In some embodiments, the isolation regions 121 comprise the same or similar material as the gate spacers 111 or the inner spacers 112.

Figure 2A:
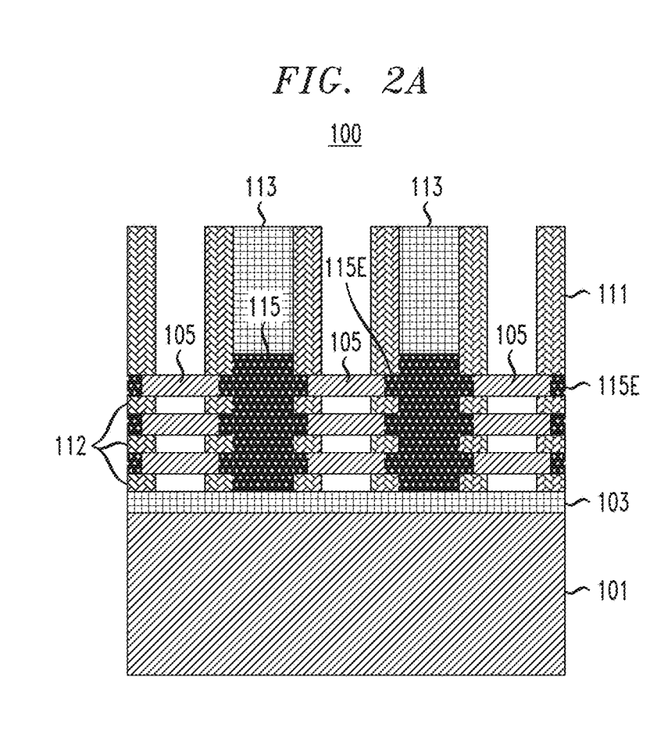
FIGS. 2A and 2B are schematic cross-sectional views illustrating epitaxial source/drain regions and mandrel channel portions of nanosheet structures following dummy gate and sacrificial semiconductor layer removal from the FIGS. 1A and 1B structures, according to an embodiment of the invention.

As shown in FIG. 2A, the dummy gate structures 110 are selectively removed to create vacant areas between the gate spacers 111 where a gate structure including, for example, gate and dielectric portions will be formed in place of the dummy gate structure 110. The selective removal can be performed using, for example hot ammonia to remove a-Si, and dHF to remove the $SiO_x$. Prior to removal of the dummy gate structures 110, the ILD layers 113 are formed on exposed portions of the epitaxial source/drain regions 115, and on sides of the gate spacers 111, which will function as spacers for resulting gate structures 140 (see FIG. 8A). The ILD layers 113 are deposited using deposition techniques such as, for example, CVD, PECVD, RFCVD, PVD, ALD, MBD, PLD, and/or LSMCD, followed by a planarization process, such as, CMP to remove excess portions of the ILD layers 113 deposited on top of the dummy gate structures 110 and the gate spacers 111. The ILD layers 113 may comprise, for example, $SiO_x$, SiOC, SiOCN or some other dielectric.

Figure 2B:
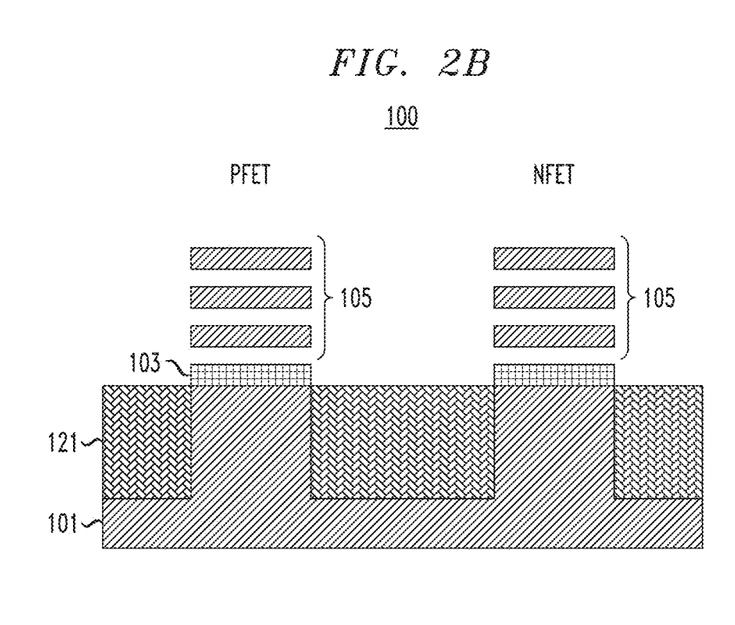

The sacrificial semiconductor layers 107 are selectively removed to create vacant areas between the inner spacers 112 where gate structures 140 will be formed in place of the sacrificial semiconductor layers 107. The sacrificial semiconductor layers 107 are selectively removed with respect to the mandrel channel portions 105, the gate spacers 111 and inner spacers 112. The selective removal can be performed using, for example, a dry HCl etch. The mandrel channel portions 105 are suspended, and anchored by the epitaxial extension regions 115E of the epitaxial source/drain regions 115.

Figure 3A:
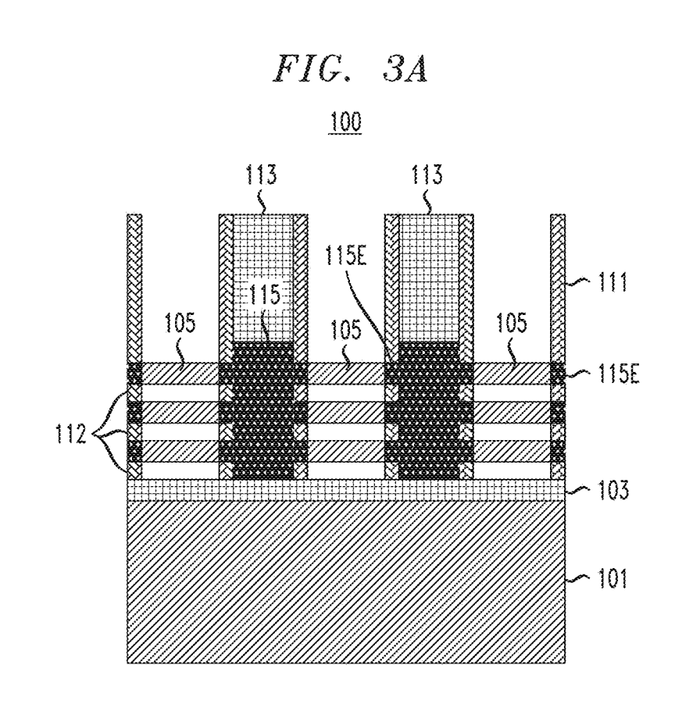
FIGS. 3A and 3B are schematic cross-sectional views illustrating nanosheet structures following recessing of spacers from the FIG. 2A structure, according to an embodiment of the invention.
Figure 3B:
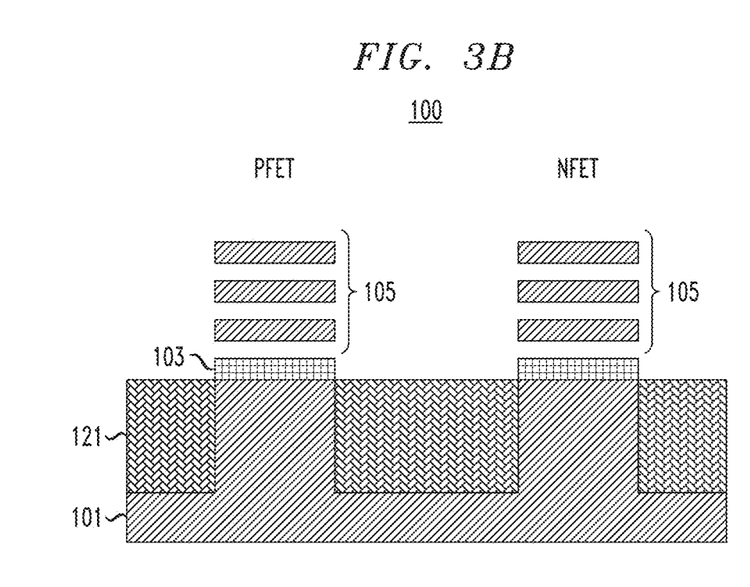

Referring to FIG. 3A, the gate spacers 111 and the inner spacers 112 are laterally recessed using, for example, a wet or dry isotropic etch back process. For instance, a remote plasma clean (RPC) process or standard dry RIE process that etches the gate spacers 111 and the inner spacers 112 selective to semiconductor materials and other dielectrics can be used. In more detail, a horizontal width of the gate spacers 111 and inner spacers 112 is selectively reduced. The widths of the gate spacers 111 and inner spacers 112 are reduced so that the outer surfaces of the gate spacers 111 and inner spacers 112 can be coplanar or substantially coplanar with the outer surfaces of the epitaxial extension regions 115E. The recessing of the inner spacers 112 permits the epitaxial extension regions 115E to be exposed during subsequent trimming of the mandrel channel portions 105 described in connection with FIGS. 4A and 4B.

Figure 4A:
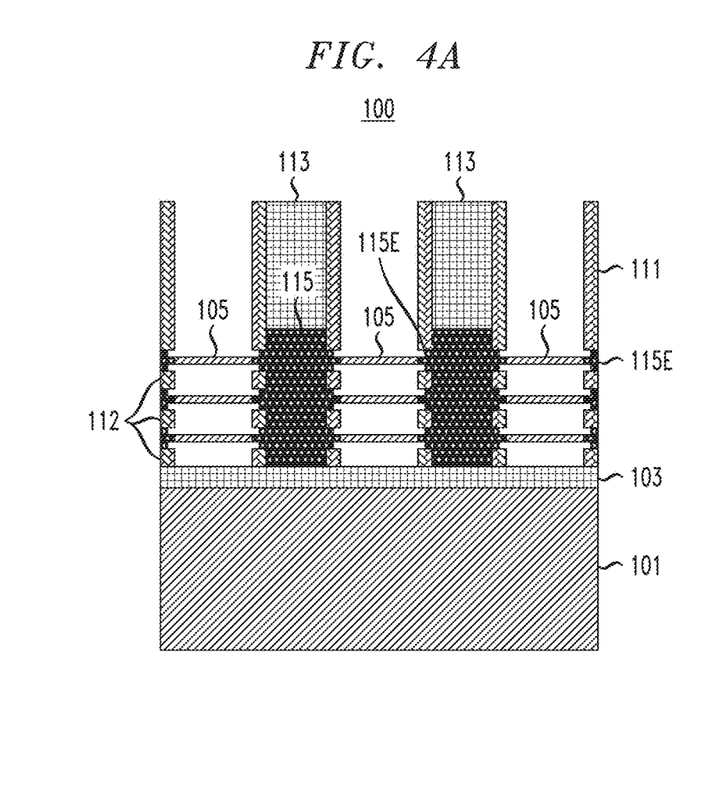
FIGS. 4A and 4B are schematic cross-sectional views illustrating nanosheet structures following trimming of the mandrel channel portions from the FIGS. 3A and 3B structures, according to an embodiment of the invention.
Figure 4B:
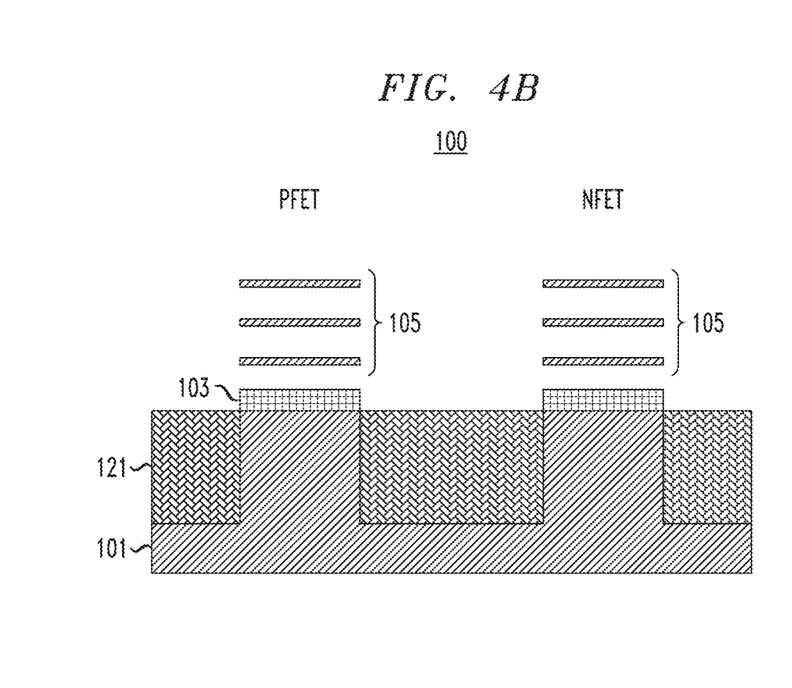

Referring to FIGS. 4A and 4B, the mandrel channel portions 105 are trimmed using a wet or dry isotropic process. For example, an RPC process etching silicon and silicon germanium or a wet process based on SC1 (NH$_4$OH:H$_2$O$_2$:H$_2$O) or ammonia can be used. As can be seen in FIGS. 4A and 4B, the thickness of the mandrel channel portions 105 is reduced. For example, the thickness is reduced to about 4 nm to about 12 nm from an original thickness of about 5 nm to about 20 nm. As explained further herein below, the resulting dimensions of the trimmed mandrel channel portions 105 defines a future distance between nanosheets (Tsus). As can be seen in FIG. 4A, the reduction in thickness of the mandrel channel portions 105 exposes the epitaxial extension regions 115E, resulting in some recessing (e.g., removal of outer portions) of the epitaxial extension regions 115E.

Figure 5A:
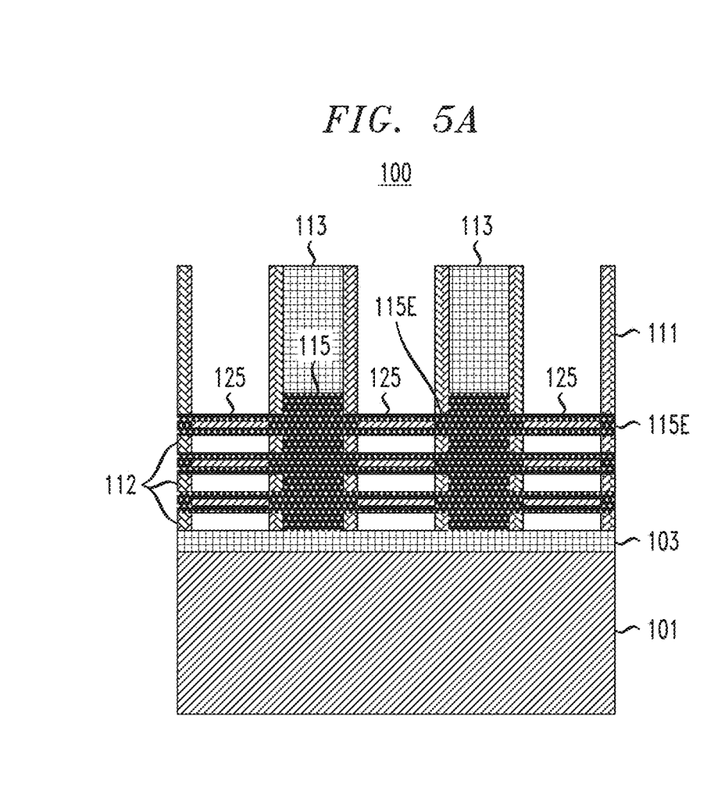
FIGS. 5A and 5B are schematic cross-sectional views illustrating nanosheet structures following growth of channel material around the trimmed mandrel channel portions of the FIGS. 4A and 4B structures, according to an embodiment of the invention.
Figure 5B:
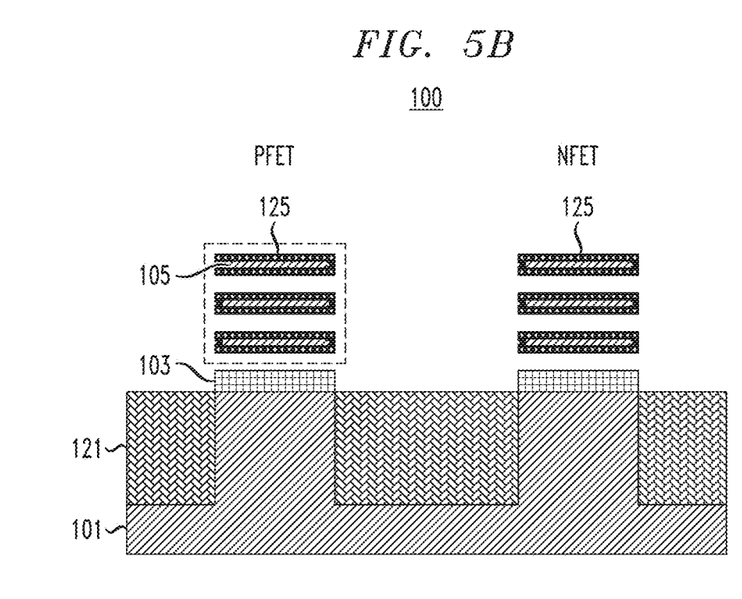
Figure 5C:
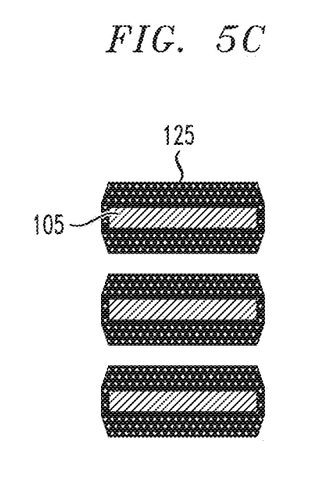
FIG. 5C is an enlarged schematic cross-sectional view illustrating the growth of the channel material around trimmed mandrel channel portions, according to an embodiment of the invention.
Figure 5D:
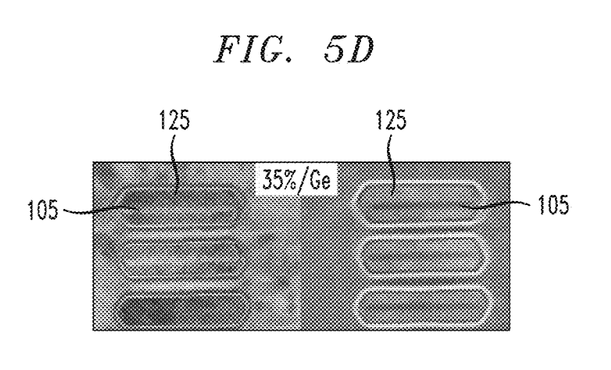
FIG. 5D is a transmission electron microscope image illustrating the growth of the channel material around trimmed mandrel channel portions, according to an embodiment of the invention.

Referring to FIGS. 5A and 5B, epitaxial channel layers 125 are grown from the trimmed mandrel channel portions 105, and from the exposed portions of the epitaxial extension regions 115E to be formed as a cladding layer around the trimmed mandrel channel portions 105. The trimmed mandrel channel portions 105 occupy a central area of an epitaxial channel layer 125 surrounding the mandrel channel portion 105. As shown in the cross-sections in FIGS. 5A, 5B and 5C, and in the image in FIG. 5D, the epitaxial channel layer 125 is formed around all sides of the mandrel channel portions 105. As shown in FIG. 5C, which is an enlarged view of the outlined portion of the cross-section of FIG. 5B, and in the image is FIG. 5D, which is the same orientation as the FIG. 5C cross-section, the epitaxial channel layer 125 may have a hexagonal or octagonal shape around the mandrel channel portion 105. The epitaxial channel layers 125 comprise the same material as the epitaxial source/drain regions 115, with the exception of any dopants that may have been added to the epitaxial source/drain regions 115. The epitaxial channel layers 125 are undoped. Referring to FIG. 5D, the epitaxial channel layers 125 in a non-limiting embodiment, comprise SiGe 35%. As shown in FIG. 5A, the epitaxial channel layers 125 are grown to laterally connect with the epitaxial extension regions 115E that function as gate to source/drain region junctions. As explained previously, and further herein below, the epitaxial channel layers 125 become the channel layers of the nanosheet stack in the final device. Accordingly, the thickness (e.g., vertical thickness) of the epitaxial channel layers 125 defines the thickness of the device channel layers.

Figure 6A:
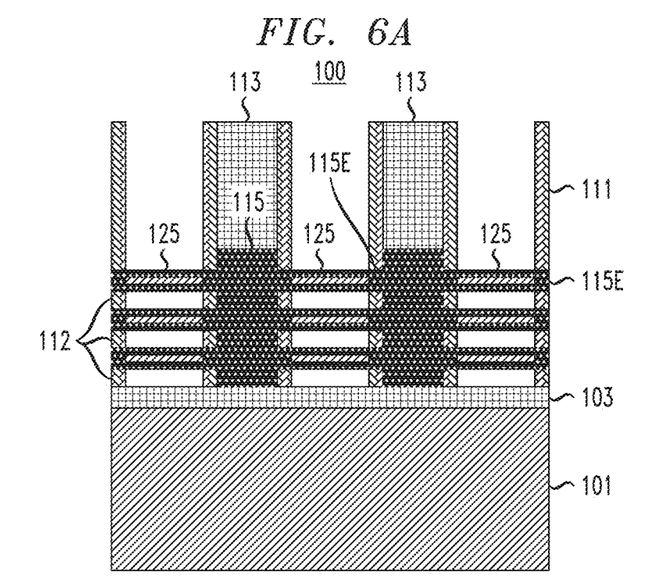
FIGS. 6A and 6B are schematic cross-sectional views illustrating nanosheet structures following removal of portions of the channel material to expose portions of the trimmed mandrel channel portions from the FIGS. 5A and 5B structures, according to an embodiment of the invention.
Figure 6B:
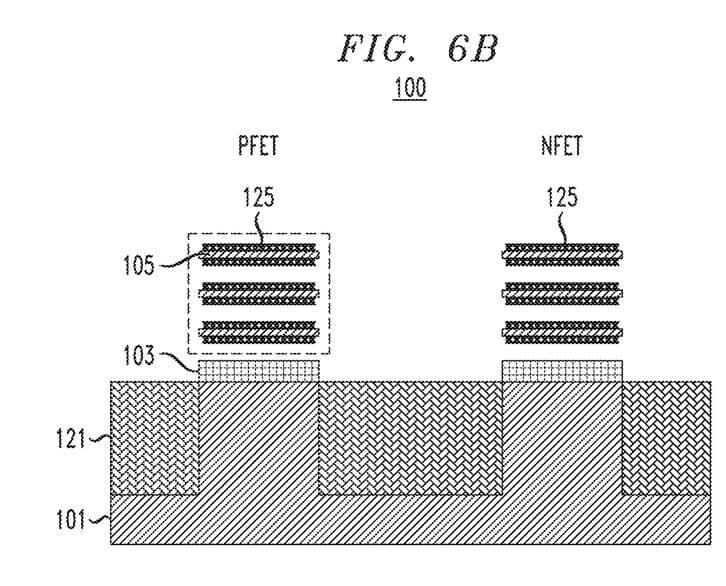
Figure 6C:
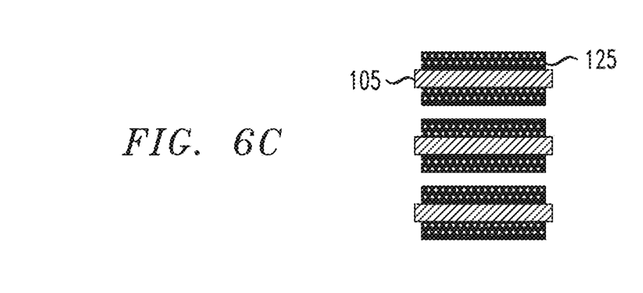
FIG. 6C is an enlarged schematic cross-sectional view illustrating the removal of portions of the channel material to expose portions of the trimmed mandrel channel portions, according to an embodiment of the invention.

Referring to FIGS. 6B and 6C, side portions of the epitaxial channel layers 125 are removed to expose the mandrel channel portions 105. According to an embodiment, referring back to FIGS. 5B, 5C and 5D, the epitaxial channel layers 125 are thinner on sidewalls (left and right sides in FIGS. 5B, 5C and 5D). The sidewalls correspond to a {110} orientation. As shown in FIG. 6B, and in FIG. 6C, which is an enlarged view of the dotted portion in FIG. 6B, an isotropic etch process is performed to remove the sidewall portions of the epitaxial channel layers 125 and expose the mandrel channel portions 105. In the case of the epitaxial channel layers 125 comprising silicon germanium, an in-situ HCl etch or isotropic etch using mild room temperature SC1 can be performed to etch only in the {110} direction and not in the {100} direction. In the case of the epitaxial channel layers 125 comprising silicon, diluted ammonia or RPC techniques can be used to remove the sidewall portions of the epitaxial channel layers 125. The removed sidewalls are not shown in FIG. 6A due to the orientation of the cross-section in that view.

Figure 7A:
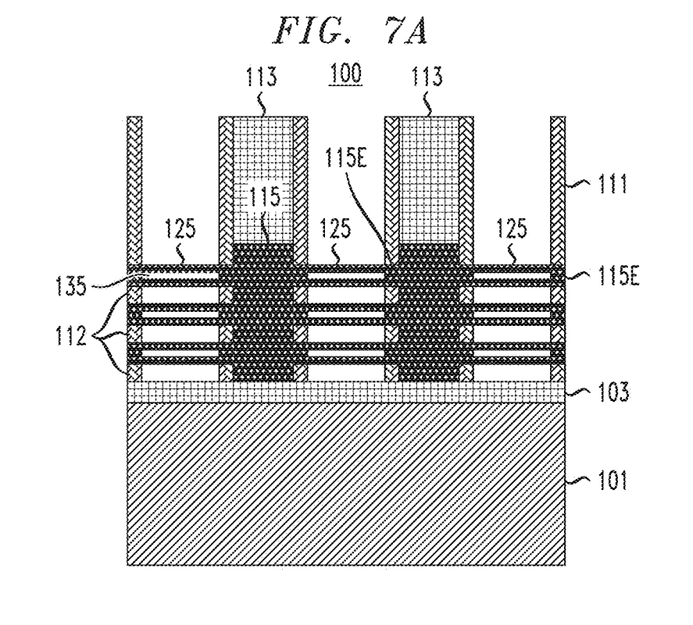
FIGS. 7A and 7B are schematic cross-sectional views illustrating nanosheet structures following removal of the trimmed mandrel channel portions from the FIGS. 6A and 6B structures, according to an embodiment of the invention.
Figure 7B:
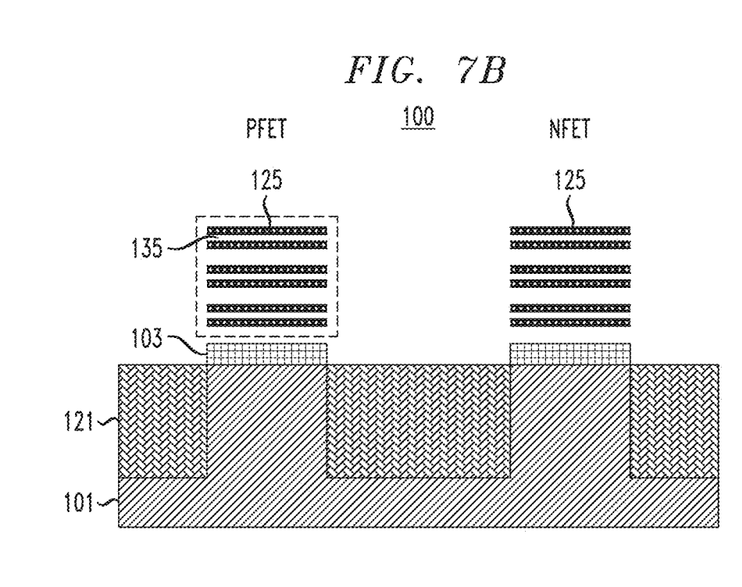
Figure 7C:
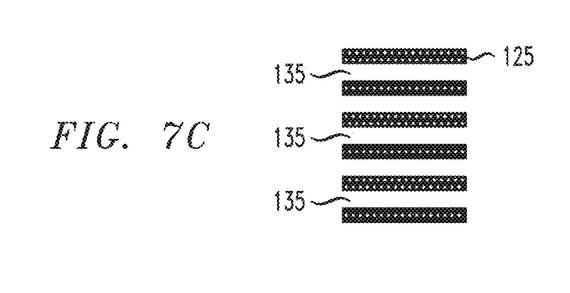
FIG. 7C is an enlarged schematic cross-sectional view illustrating the removal of the trimmed mandrel channel portions, according to an embodiment of the invention.

Referring to FIGS. 7A, 7B and 7C, the mandrel channel portions 105 are selectively removed with respect to epitaxial channel layers 125. The mandrel channel portions 105 are removed by etching from the exposed sidewalls the mandrel channel portions 105. In the case of the mandrel channel portions 105 comprising silicon, diluted ammonia or RPC (e.g., Tokyo Electron Limited (TEL) LEAGA®) techniques can be used to remove the mandrel channel portions 105. In the case of the mandrel channel portions 105 comprising silicon germanium, HCl etch, SC1 or RPC (e.g., TEL LEAGA®) techniques can be used to remove the mandrel channel portions 105. The etchant accesses the mandrel channel portions 105 via the exposed sides thereof, and removes the mandrel channel portions 105 to create a plurality of vacant areas 135. As can be seen in FIGS. 7A-7C, the number of remaining epitaxial channel layers 125 is double that of the number of mandrel channel portions 105. The epitaxial channel layers 125 will function as the channels of the nanosheet stacks in the final nanosheet transistor devices. Using the techniques of the embodiments, the number of nanosheet channels is increased (e.g., doubled) without increasing nanosheet stack height and without increasing epitaxial source/drain region volume. The sacrificial etch of the mandrel channel portions 105 removes the mandrel channel portions 105, leaving twice the amount of epitaxial channel layers 125, which were on top and bottom sides of the mandrel channel portions 105.

As can be seen in FIG. 7A, the epitaxial channel layers 125 are connected to the epitaxial source/drain regions 115 via the epitaxial extension regions 115E. Respective pairs of adjacent epitaxial channel layers 125 are connected to a given one of the epitaxial source/drain regions 115 via respective ones of the plurality of epitaxial extension regions 115E. For example, a first pair of epitaxial channel layers 125 comprising the topmost epitaxial channel layer 125 and the epitaxial channel layer 125 immediately below the topmost epitaxial channel layer 125 is connected to one of the epitaxial source/drain regions 115 via one epitaxial extension region 115E, a second pair comprising two middle epitaxial channel layers 125 is connected to one of the epitaxial source/drain regions 115 via another epitaxial extension region 115E, and a third pair comprising the bottom most epitaxial channel layer 125 and the epitaxial channel layer 125 immediately above the bottom most epitaxial channel layer 125 is connected to one of the epitaxial source/drain regions 115 via yet another epitaxial extension region 115E. In other words, two consecutively stacked epitaxial channel layers 125 share the same epitaxial extension region 115E connecting the two consecutively stacked epitaxial channel layers 125 to an epitaxial source/drain region 115. The inner spacers 112 are disposed under and/or over respective ones of the epitaxial extension regions 115E. The epitaxial source/drain regions 115 are positioned on lateral sides of the inner spacers 112 and the epitaxial extension regions 115E.

Figure 8A:
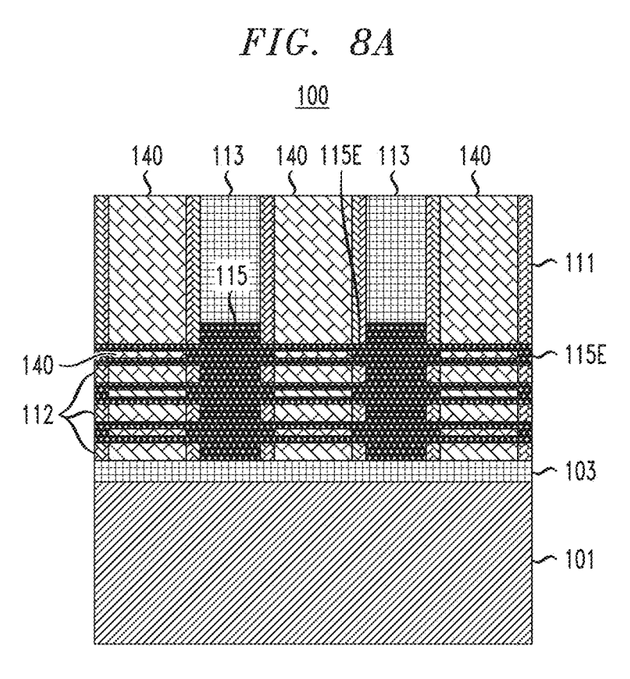
FIGS. 8A and 8B are schematic cross-sectional views illustrating nanosheet structures following gate structure formation on the FIGS. 7A and 7B structures, according to an embodiment of the invention.
Figure 8B:
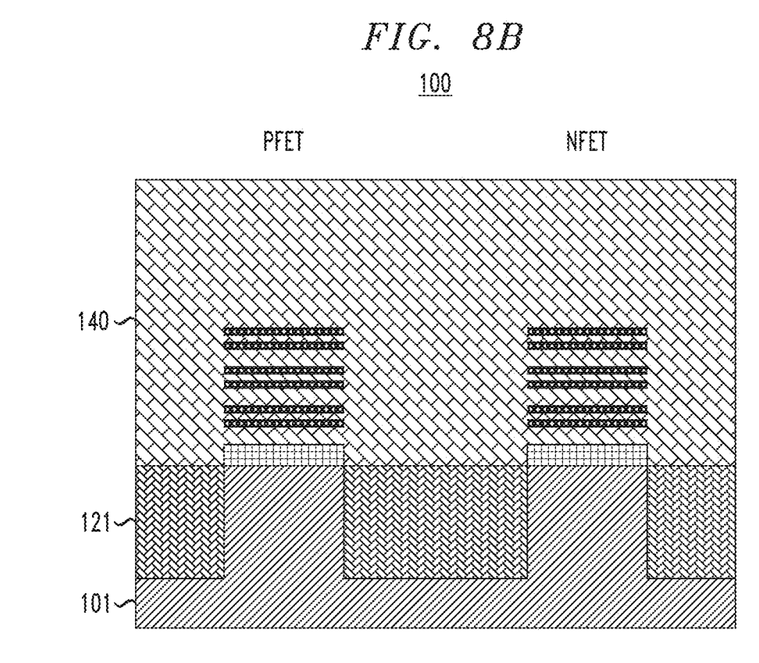

Referring to FIGS. 8A and 8B, gate structures 140 including, for example, gate and dielectric portions, are formed in the vacant areas 135, and in the vacant areas between the inner spacers 112 and between the gate spacers 111. The gate structures 140 are formed in place of the removed dummy gate structures 110, the removed sacrificial semiconductor layers 107 and the removed mandrel channel portions 105. According to an embodiment, each gate structure 140 includes a gate dielectric layer such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structures 140 each include a gate region including a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. The inner spacers 112 remain on lateral sides of the gate structures 140 that replaced the sacrificial semiconductor layers 107.

According to an embodiment, depending on the resulting thickness of the trimmed mandrel channel portion 105, gate structures 140 replacing the mandrel channel portions 105 and filling in the vacant areas 135 between respective pairs of adjacent epitaxial channel layers 125 may have a different thickness than gate structures 140 filling in the vacant areas between the inner spacers 112 previously occupied by the sacrificial semiconductor layers 107. For example, the gate structures 140 replacing the mandrel channel portions 105 may have a smaller thickness than the gate structures 140 replacing the sacrificial semiconductor layers 107. The gate structures 140 may be in a gate-all-around configuration.

The epitaxial source/drain regions 115 are positioned on lateral sides of the gate structures 140 and the epitaxial channel layers 125. The epitaxial extension regions 115E are positioned between respective pairs of adjacent epitaxial channel layers 125 and the epitaxial source/drain regions 115. In addition, the gate spacers 111 are disposed on uppermost ones of the epitaxial extension regions 115E.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
  a plurality of gate structures alternately stacked with a plurality of channel layers; and
  a plurality of epitaxial source/drain regions connected to the plurality of channel layers;
  wherein the plurality of channel layers are connected to the plurality of epitaxial source/drain regions via a plurality of epitaxial extension regions; and
  wherein respective pairs of adjacent channel layers of the plurality of channel layers are connected to a given one of the plurality of epitaxial source/drain regions via respective ones of the plurality of epitaxial extension regions.

2. The semiconductor structure of claim 1, further comprising a plurality of inner spacers disposed between respective ones of the plurality of epitaxial extension regions.

3. The semiconductor structure of claim 2, wherein first gate structures of the plurality of gate structures between the respective pairs of adjacent channel layers have a smaller thickness than second gate structures of the plurality of gate structures adjacent the plurality of inner spacers.

4. The semiconductor structure of claim 2, wherein the plurality of epitaxial source/drain regions are positioned on lateral sides of the plurality of inner spacers.

5. The semiconductor structure of claim 1, wherein the plurality of epitaxial source/drain regions are positioned on lateral sides of the plurality of gate structures and the plurality of channel layers.

6. The semiconductor structure of claim 1, wherein the plurality of epitaxial extension regions are positioned between the respective pairs of adjacent channel layers and the plurality of epitaxial source/drain regions.

7. The semiconductor structure of claim 1, wherein the plurality of channel layers comprise a same material as the plurality of epitaxial source/drain regions.

8. The semiconductor structure of claim 1, further comprising a plurality of gate spacers disposed on uppermost ones of the plurality of epitaxial extension regions.

9. A nanosheet structure, comprising:
a plurality of channel layers in a stacked configuration; and
a plurality of epitaxial source/drain regions extending from sides of the plurality of channel layers;
wherein the plurality of epitaxial source/drain regions extend from the sides of the plurality of channel layers via a plurality of epitaxial extension regions; and
wherein a given pair of adjacent channel layers of the plurality of channel layers is connected to a given one of the plurality of epitaxial source/drain regions via a same epitaxial extension region of the plurality of epitaxial extension regions.

10. The nanosheet structure of claim 9, further comprising a plurality of inner spacers disposed at least one of under and over respective ones of the plurality of epitaxial extension regions.

11. The nanosheet structure of claim 9, further comprising a plurality of gate structures alternately stacked with the plurality of channel layers.

12. A gate-all-around nanosheet device, comprising:
a plurality of stacked channels;
a plurality of source/drain regions on lateral sides of the plurality of stacked channels;
wherein at least two consecutively stacked channels share a same connective portion to a source/drain region of the plurality source/drain regions; and
wherein regions between the plurality of stacked channels comprise a plurality of stacked gate structures.

13. The gate-all-around nanosheet device of claim 12, further comprising a plurality of inner spacers disposed at least one of under and over respective ones of a plurality of connective portions to the plurality source/drain regions.

14. The gate-all-around nanosheet device of claim 13, wherein a first gate structure of the plurality of stacked gate structures between the at least two consecutively stacked channels has a smaller thickness than at least one second gate structure of the plurality of stacked gate structures adjacent at least one of the plurality of inner spacers.

15. The gate-all-around nanosheet device of claim 13, wherein the plurality of source/drain regions are positioned on lateral sides of the plurality of inner spacers.

16. The gate-all-around nanosheet device of claim 12, wherein the plurality of source/drain regions are positioned on lateral sides of the plurality of stacked gate structures.

17. The gate-all-around nanosheet device of claim 12, wherein the connective portion is positioned between the at least two consecutively stacked channels and the source/drain region.

18. The nanosheet structure of claim 10, further comprising a plurality of gate structures alternately stacked with the plurality of channel layers, wherein a first gate structure of the plurality of gate structures between the given pair of adjacent channel layers has a smaller thickness than at least one second gate structure of the plurality of gate structures adjacent at least one of the plurality of inner spacers.

19. The nanosheet structure of claim 10, wherein the plurality of epitaxial source/drain regions are positioned on lateral sides of the plurality of inner spacers.

20. The nanosheet structure of claim 9, wherein the epitaxial extension region is positioned between the given pair of adjacent channel layers and the given one of the plurality of epitaxial source/drain regions.

* * * * *